(12) United States Patent
Cheng et al.

(10) Patent No.: US 9,343,526 B2
(45) Date of Patent: May 17, 2016

(54) DEEP TRENCH ISOLATION

(71) Applicant: FREESCALE SEMICONDUCTOR, INC., Austin, TX (US)

(72) Inventors: Xu Cheng, Chandler, AZ (US); Daniel J. Blomberg, Chandler, AZ (US); Zhihong Zhang, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 181 days.

(21) Appl. No.: 13/801,514

(22) Filed: Mar. 13, 2013

(65) Prior Publication Data
US 2014/0264724 A1 Sep. 18, 2014

(51) Int. Cl.
| | |
|---|---|
| H01L 29/72 | (2006.01) |
| H01L 29/06 | (2006.01) |
| H01L 27/108 | (2006.01) |
| H01L 21/761 | (2006.01) |
| H01L 21/8238 | (2006.01) |
| H01L 21/762 | (2006.01) |

(52) U.S. Cl.
CPC .......... *H01L 29/0611* (2013.01); *H01L 21/761* (2013.01); *H01L 21/76224* (2013.01); *H01L 21/76237* (2013.01); *H01L 21/823878* (2013.01); *H01L 27/10876* (2013.01)

(58) Field of Classification Search
CPC ................. H01L 21/823878; H01L 21/76237; H01L 21/761; H01L 27/10876
USPC .................................................. 257/374, 510
See application file for complete search history.

(56) References Cited

U.S. PATENT DOCUMENTS

| | | | |
|---|---|---|---|
| 7,608,908 B1 | 10/2009 | Khemka et al. | |
| 7,723,800 B2 | 5/2010 | Moens et al. | |
| 2008/0237656 A1* | 10/2008 | Williams et al. | 257/262 |
| 2008/0290461 A1* | 11/2008 | Moens et al. | 257/536 |

OTHER PUBLICATIONS

Parthasarathy, V. et al., "A Multi Trench Analog+Logic Protection (M-TRAP) for Substrate Crosstalk Prevention in a 0.25µm Smart Power Platform with 100 V High-side Capability," ISPSD 2004, pp. 427-430.

Desoete, B. et al., "A Multiple Deep Trench Isolation Structure with Voltage Divider Biasing," ISPSD 2007, pp. 213-216.

* cited by examiner

*Primary Examiner* — Howard Weiss
*Assistant Examiner* — Tifney Skyles

(57) ABSTRACT

An integrated semiconductor device includes a substrate of a first conductivity type, a buried layer located over the substrate, an isolated region located over a first portion of the buried layer, and an isolation trench located around the isolated region. A punch-through structure is located around at least a portion of the isolation trench. The punch-through structure includes a second portion of the buried layer, a first region located over the second portion of the buried layer, the first region having a second conductivity type, and a second region located over the first region, the second region having the first conductivity type.

7 Claims, 7 Drawing Sheets

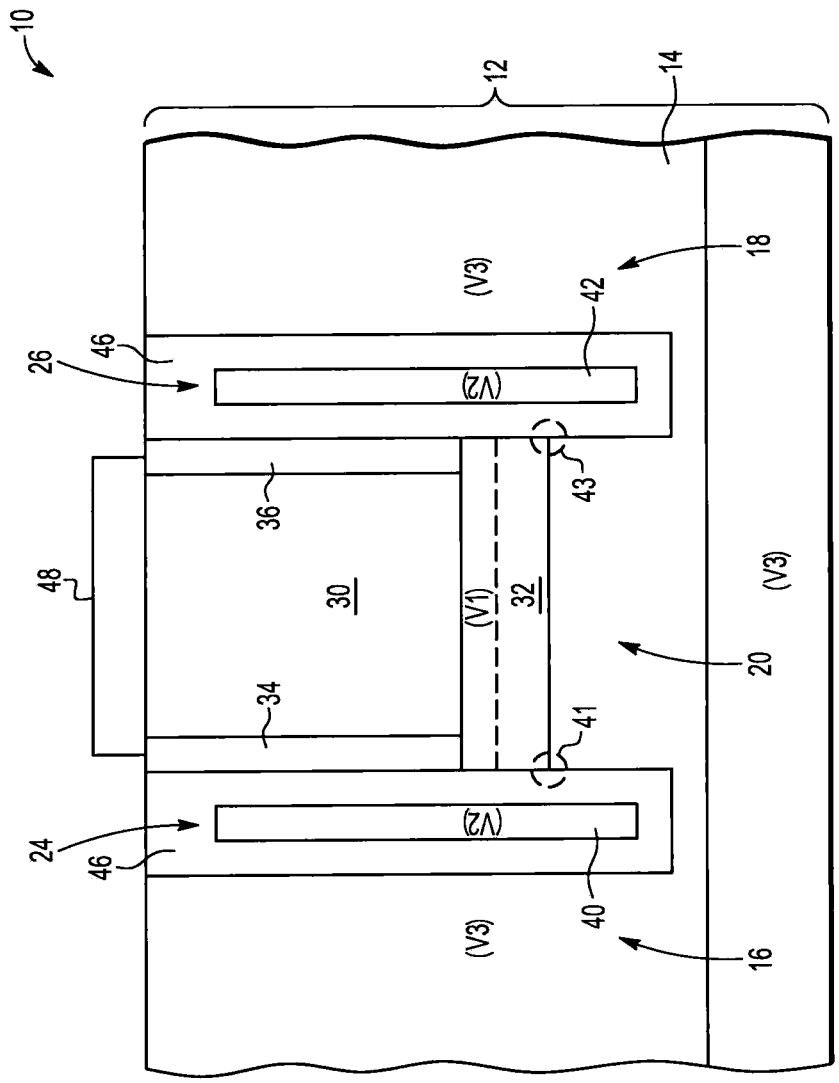
FIG. 1A -PRIOR ART-

DEEP TRENCH ISOLATION

FIELD OF THE INVENTION

Embodiments of the inventive subject matter relate to deep trench isolation and, specifically, deep trench isolation providing an improved isolation breakdown voltage.

BACKGROUND OF THE INVENTION

Electronic devices, especially semiconductor devices and integrated circuits (ICs), often include multiple, separate semiconductor-based components fabricated on the same semiconductor substrate or die. The components usually operate independently from one another. Consequently, it can be desirable to provide electrical isolation between the various components that are fabricated upon the same substrate. In conventional devices, dielectric-lined trenches are often used for lateral isolation due to their superior isolation properties and small area-consumption, while junction isolation is utilized for vertical isolation. As the operating voltage and component density (components per unit area) on the substrate increase, however, it often becomes difficult to maintain the desired isolation breakdown voltage. Additionally, there can be a tendency for the distribution of breakdown voltages observed across a die or wafer to widen with increased packing density of semiconductor components, which can lead to lower manufacturing yields.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

FIG. 1A is a simplified cross-sectional view of an exemplary electronic circuit employing a prior art isolation structure.

DETAILED DESCRIPTION

Figure 1B:
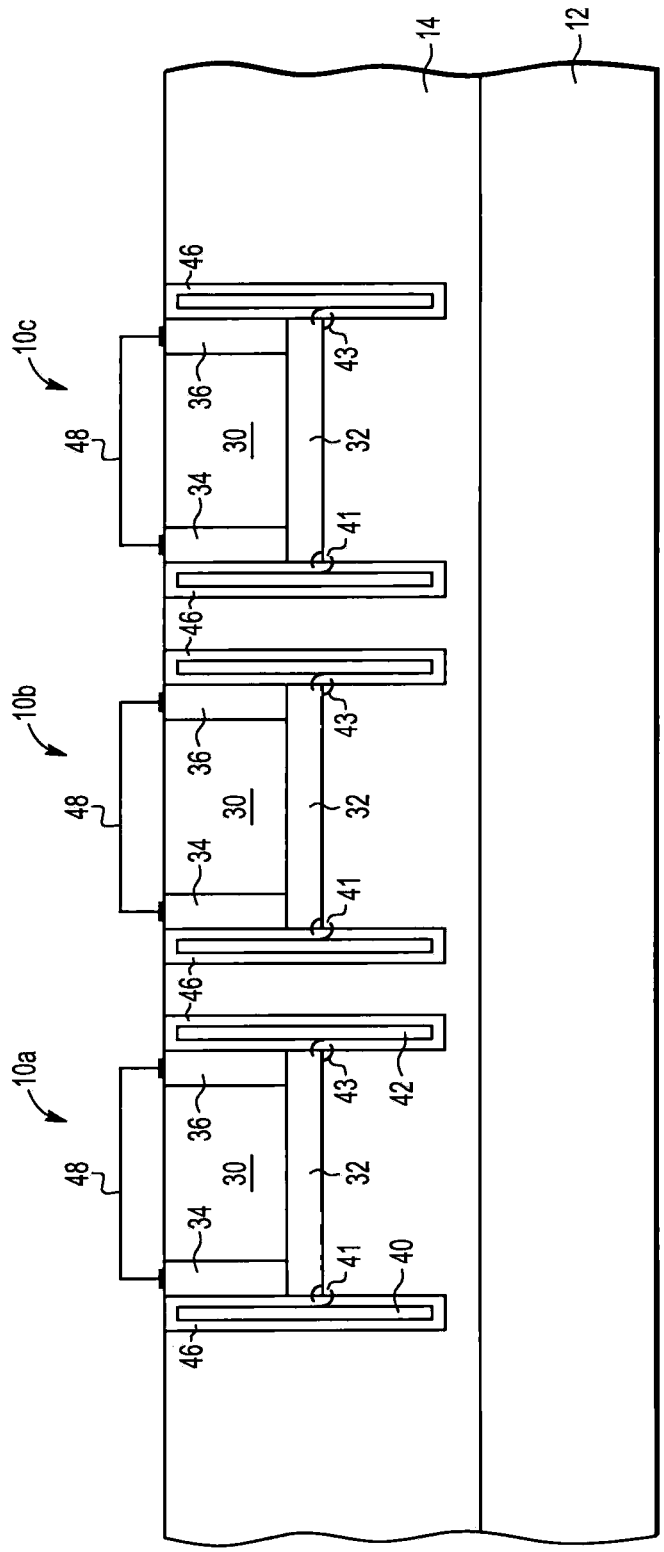
FIG. 1B is a simplified cross-sectional view of an exemplary electronic device employing a number of prior art isolation structures formed over a single substrate.

Embodiments of the inventive subject matter relate to deep trench isolation and, specifically, deep trench isolation providing an improved isolation breakdown voltage.

In one implementation, an integrated semiconductor device includes a substrate of a first conductivity type, a buried layer located over the substrate, an isolated region located over a first portion of the buried layer, and an isolation trench located around the isolated region. A punch-through structure is located around at least a portion of the isolation trench. The punch-through structure includes a second portion of the buried layer, a first region located over the second portion of the buried layer, the first region having a second conductivity type, and a second region located over the first region, the second region having the first conductivity type.

In another implementation, a method of manufacturing a device includes forming a buried layer over a substrate of a first conductivity type, and forming an isolation trench around an isolated region. The isolated region is disposed over a first portion of the buried layer. The method includes forming a punch-through structure around at least a portion of the isolation trench by forming a first region over a second portion of the buried layer, the first region having a second conductivity type, and forming a second region located over the first region, the second region having the first conductivity type.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that includes a list of elements is not necessarily limited to those elements, but may include other elements not expressly listed or inherent to such process, method, article, or apparatus. The term "coupled," as used herein, is defined as directly or indirectly connected in an electrical or non-electrical manner.

The various embodiments of the disclosure are illustrated by semiconductor components and structures of particular conductivity type having various P and N doped regions appropriate for that conductivity type device or structure. But this is merely for convenience of explanation and not intended to be limiting. Persons of skill in the art will understand that components or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", where the first conductivity type may be either N or P type and the second opposite conductivity type is then either P or N type, and so forth.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures (e.g., semiconductor-on-insulator (SOI) structures), and combinations thereof. For convenience of explanation and not intended to be limiting, semiconductor components and methods of fabrication are described herein for silicon semiconductors but persons of skill in the art will understand that other semiconductor materials may also be used.

Within a semiconductor-based electronic device a number of independent semiconductor components may be formed over a single substrate. To ensure that each semiconductor component operates correctly, the semiconductor components are electrically isolated from one another and from the substrate using an isolation structure. Each component is formed within an isolated region of the isolation structure. For each isolation structure, lateral isolation of the isolated region is often achieved by encircling the isolated region with an insulative trench structure configured to inhibit current flow from one component on the substrate to the next. Vertical isolation is achieved using junction isolation between the isolated region and the substrate. The degree to which each component is electrically isolated from surrounding components and substrate affects the maximum voltage at which the semiconductor device can operate.

The isolation voltage capability of a particular isolation structure refers to the maximum voltage that an isolated region of the isolation structure may be exposed to without affecting the operation of other semiconductor components formed over the same substrate in a way that is detrimental to the operation of the entire electronic device. If the voltage of the isolated region is too great, some amount of current significantly exceeding a normal leakage current begins to flow from the isolated region to other isolated regions or the substrate, which will cause the components in other isolated regions to malfunction and may cause significant power consumption, or even burning of the overall device. This current, sometimes referred to as cross-talk, limits the maximum voltage that may be utilized by the device, thereby limiting the capabilities of the individual semiconductor components.

Within a particular semiconductor device a number of factors can operate to reduce the isolation breakdown voltage of a particular isolation structure. First, as the number of components formed over a single substrate increase, the density of the individual semiconductor components on the substrate also increases. As the component density increases, the density of isolation trenches formed around the components increases correspondingly. The trenches are generally lined with an oxide material that is deposited into the trenches by chemical vapor deposition (CVD) or thermal oxidation. As the trench density increases, the dense trench structure forms a large surface area that must be coated evenly with oxide material in order that the trenches provide the desired isolation. However, if the trench structure becomes so dense that the total amount of oxide material to be deposited reaches the process limit, then deficiencies in the deposition process may result in the thickness of the oxide lining of the trenches becoming too thin in certain areas. These thin regions of oxide result in a lower breakdown voltage for the device. Experimentation has shown an approximately 20V drop in breakdown voltage trench density increases beyond 10%.

In one embodiment, at maximum density (i.e., when the components are packed together using minimum spacing design rules at a density of approximately 34.9%), the isolation voltage capability can be reduced by as much as 15%, if not greater.

Table 1, below, shows isolation breakdown voltage data for an example semiconductor device and relates component density percentage (%) to isolation voltage breakdown capability in volts (V).

TABLE 1

| Density | Isolation Voltage Breakdown Capability |
| --- | --- |
| Less then 0.7% | 102 V |
| 6.3% | 102.1 V |
| 9.2% | 102 V |
| 17.1% | 89.1 V |
| 20.2% | 89.3 V |
| 25.1% | 88.5 V |
| 29.9% | 86.6 V |
| 34.9% | 85.6 V |

Another factor that affects the isolation breakdown voltage for a particular isolation structure is temperature stresses over the operational lifetime of the component. During one exemplary high-temperature operating lifetime (HTOL) stress test conducted at 150 Celsius, 80V, and for 1,000 hours, the isolation breakdown voltage of a relatively dense-structure device (with density over 10%) can be reduced by approximately 2V to 5V due to charge injection and capture occurring in the polysilicon-oxide-silicon structure of the isolation trenches. In many devices this reduction can cause the device to fail to satisfy device operating requirements.

FIG. 1A is a simplified cross-sectional view of an exemplary electronic circuit employing a prior art isolation structure. Device 10 is formed over substrate layer 12, over which a number of semiconductor devices, isolation walls, or other structures may be formed. In FIG. 1A, substrate layer 12 may include a P++-type region. P EPI region 14, therefore is formed within substrate layer 12. P EPI layer 14 includes three regions. Region 16 of P EPI layer 14 occupies a region outside trench 24. Region 18 of P EPI layer 14 occupies a region outside trench 26. Region 20 of P EPI layer 14 is positioned below isolated region 30.

N-type buried layer (NBL) 32 is formed over region 20 of P EPI layer 14. N-type regions 34 and 36 are formed over NBL 32 and may be electrically interconnected, such as by connection 48. In various implementations, N-type regions 34 and 36 may be formed in contact with trench regions 24 and 26, or away from trench regions 24 and 26, but within isolated region 30. N-type regions 34 and 36 may be formed so as to encircle a portion of isolated region 30. Alternatively, N-type regions 34 and 36 may be formed along one or more walls of isolated region 30, or along portions of one or more walls of isolated region 30.

Polysilicon 40 and 42 are disposed into trenches 24 and 26, respectively. Polysilicon 40 and 42 sometimes operates to provide structural support to isolation structure 10 and provide protection from environmental shock, such as result from thermal expansion of isolation structure 10 during operation of one or more of the semiconductor devices formed over substrate layer 12. Oxide layer 46 is formed about polysilicon 40 and 42.

After the formation of NBL 32, trenches 24 and 26 (and corresponding oxide 46 and polysilicon 40 and 42), and N-type regions 34 and 36, isolated region 30 is electrically isolated and can be used freely to build components and/or circuitry within isolated region 30. As such, there may be a number of N-type and/or P-type regions formed within isolated region 30 after the desired components and/or circuitry are formed.

To provide that the semiconductor components operate correctly (without interfering with the operation of other nearby components), isolated region 30 is isolated laterally and vertically. Lateral isolation (i.e., electrical isolation from other components formed over substrate layer 12) is generally provided to isolated region 30 by oxide 46 deposited into one or more trenches formed about the semiconductor component in combination with N type regions 34 and 36. Vertical isolation (i.e., electrical isolation from substrate layer 12) of isolated region 30 is provided by NBL 32 and, particularly, the junction between NBL 32 and region 20 of P EPI 14. The junction between NBL 32 and P EPI 14 forms a PN junction that is generally reverse-biased, providing electrical isolation to isolated region 30 up to the isolation breakdown voltage of the component. In such a configuration, the lateral isolation provided by oxide 46 provides more effective isolation than the vertical isolation provided by the junction between NBL 32 and P EPI 14. Accordingly, the vertical isolation provided by the PN junction between NBL 32 and P EPI 14 becomes a limiting factor for the isolation breakdown voltage of the structure. The weakest points of isolation are generally found at the regions indicated by dashed circles 41 and 43 depicted on FIG. 1A. Thus, this breakdown voltage of the entire isolation structure may be referred to as the substrate breakdown voltage, or $BV_{sub}$. Given a particular $BV_{sub}$ for an isolation structure, the structure is then given a rated isolation voltage ($V_{iso,rated}$) which, when the isolation structure 10 is operated at $V_{iso,rated}$, provides enough margin for safe operation of the isolation structure.

The details of the devices located in isolated region 30 have been omitted in the various drawings, since these details are not important to the present disclosure. In general, one or more of a transistor, a resistor, a diode, a capacitor and the like, and combinations thereof, may be formed within isolated region 30.

The isolation structure depicted in FIG. 1A can be repeated over a particular substrate to isolate a number of separate components. For example, FIG. 1B is a simplified cross-sectional view of an exemplary electronic device employing a number of prior art isolation structures formed over a single substrate. In FIG. 1B, the isolation structure 10 depicted in FIG. 1A has been repeated a number of times over a single substrate to include isolation structures 10a, 10b, and 10c, each of isolation structures 10a, 10b, and 10c include isolated regions in which different components or devices may be formed.

Returning to FIG. 1A, isolated region 30 is isolated so that the semiconductor component formed therein may operate at any voltage between 0V and the rated isolation voltage $V_{iso,rated}$ of the isolation structure. In an example component that may employ the structure shown in FIG. 1A, the breakdown voltage $BV_{sub}$ can be approximately 110V, enabling a component to safely operate presuming an isolation breakdown voltage $V_{iso,rated}$ of 80V (with a sufficient margin-of-error to meet operating requirements). Accordingly, the voltage within isolated region 30 can vary from 0V to 80V during normal component operations. In the configuration shown in FIG. 1A, when isolated region 30 operates at a particular potential at the position indicated by label V1 in FIG. 1A, NBL 32 shares the same potential. Substrate layer 12 is also set to a potential (usually a reference voltage, such as ground) indicated by the label V3 on FIG. 1A, which is shared with P EPI 14. Polysilicon 40 and 42 are surrounded by oxide 46 and each has a floating potential (indicated by label V2 on FIG. 1A). As such, the potentials of polysilicon 40 and 42 are free to float and become coupled to a potential influenced by V1 and V3 (the coupling is analogous to capacitive coupling). For example, if V1 is equal to $V_{iso,rated}$ for a conventional device (e.g., 80V), and V3 is equal to 0V, the voltage V2 may float to approximately 20V. Accordingly, the entire voltage $V_{iso,rated}$ is dropped across the weakest part of the isolation structure at locations 41 and 43.

In the present system, to mitigate the problems associated with conventional isolation approaches, including the reduction in $BV_{sub}$ resulting from increased component density and HTOL operating conditions, an alternative isolation approach is presented. The present isolation structure includes one or more isolation trench rings formed around the central isolated region. Each of the additional isolation trench rings is paired with a punch-through structure configured to reduce the potential subjected to the weak points of the isolation structure (see, for example, regions 41 and 43 of FIG. 1A). This approach can be used to control the potential difference between NBL regions of the different trenches as well as pull-up the potential of the polysilicon plug inside each isolation trench. In this manner, a higher $BV_{sub}$ can be achieved for the structure, even at higher component densities.

In various implementations, the isolation structure may include two or more punch-through structures, each separated by isolation trench rings. For example, the structure may be formed with an inner trench ring around an isolated region, a first punch-through structure about at least a portion of the inner trench ring, a middle trench ring formed around the first punch-through structure and isolated region, a second punch-through structure formed about at least a portion of the middle trench ring, and an outer trench ring formed around the second punch-through structure and the middle trench ring. In this manner, additional isolation structures including two or more punch-through structures may be fabricated.

When incorporating multiple punch-through structures into the isolation structure, the configuration of the various punch-through structures can be selected to achieve optimal device performance.

The present isolation structure may be utilized to isolate a number of different semiconductors components that may be formed over a substrate. Accordingly, when multiple semiconductor components are formed over a substrate, one or more of those components may be provided within the present isolation structure. In that case, the various isolation structures may optionally be separated by P well regions, though such structures are optional. Depending upon the system requirements, only a subset of the semiconductor components within a particular device may be isolated. Or, alternatively, all components may be isolated using the approach of the present disclosure.

Figure 2A:
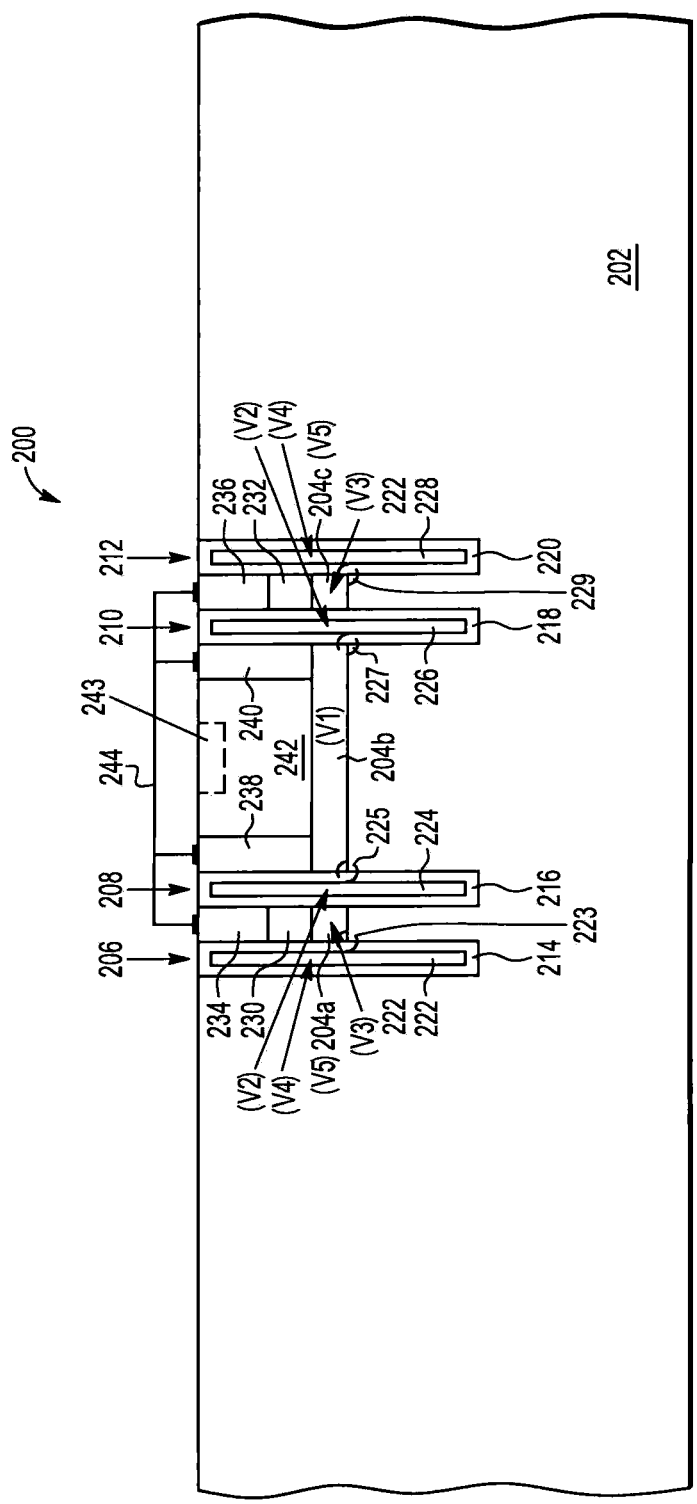
FIG. 2A is a simplified cross-sectional view of an exemplary isolation structure formed in accordance with the present disclosure.

FIG. 2A is a cross-sectional view of an exemplary isolation structure formed in accordance with the present disclosure. Isolation structure 200 is formed over substrate 202 that may be of a first conductivity type, such as a p-type substrate. In some implementations, substrate 202 can have the format depicted of the substrate layer 12 of FIG. 1A (i.e., P-EPI/P+ substrate), though other substrate configurations may be utilized. A highly doped buried layer 204, of opposite conductivity from substrate 202, is formed over substrate 202. Isolation trenches 206, 208, 210, and 212 are formed in substrate 202, partially penetrating through the highly doped buried layer 204 and forming portions 204a, 204b, and 204c of the highly doped buried layer 204. In some implementations, where the trenches are formed all the way around isolated region 242, trenches 208 and 210 form different parts of a single trench that wraps around isolated region 242. Similarly, trenches 206 and 212 may form part of a single trench that wraps around isolated region 242. Within each of isolation trenches 206, 208, 210, and 212, oxide 214, 216, 218, and 220, respectively, are deposited. Polysilicon plugs 222, 224, 226, and 228 are formed within each of oxide 214, 216, 218, and 220, respectively.

Regions 230 and 232 are formed over portions 204a and 204c, respectively, of the highly doped buried layer 204 between trenches 206 and 208, and 210 and 212, respectively. Regions 230 and 232 are generally of the same conductivity type to that of substrate 202.

Regions 234 and 236 are formed over regions 230 and 232. Regions 234 and 236 are generally of an opposite conductivity type to regions 230 and 232 and, therefore, together form a punch-through structure.

Regions 238 and 240, having the same conductivity type as highly doped buried layer 204, are formed over portion 204b of highly doped buried layer 204. Regions 238 and 240 may be formed so as to encircle a portion of isolated region 242. Alternatively, regions 238 and 240 may be formed along one or more walls of isolated region 242, or along portions of one or more walls of isolated region 242.

Isolated region 242 (generally having a conductivity type that is opposite from that of substrate 202) is defined by the surrounding structures and is positioned over portion 204b of highly doped buried layer 204 and between regions 238 and 240. Isolated region 242 forms a pocket within which one or more electronic devices or components 243, such as transistors, resistors, and capacitors may be formed. In general, isolated region 242 can be used freely to build components and/or circuitry. As such, there may be a number of N-type and/or P-type regions formed within isolated region 242 after the desired components and/or circuitry are formed.

Finally, each of regions 234, 236, 238, and 240 can be electrically interconnected, as shown by connection 244.

As described above, isolation structure 200, depicted in FIG. 2A, provides an improved $BV_{sub}$ over conventional isolation structures. In general, the punch-through structures created by the junctions between regions 234 and 236 and regions 230 and 232, respectively, operate to distribute the potentially more evenly across the whole isolation structure. As such, the electrical field formed within the isolation structure is spread out across the main isolation junction beneath isolated region 242 as well as the isolation junctions of the additional isolation trench rings and punch-through structures.

For example, with reference to FIG. 2A, isolated region 242 is set to a potential represented by the label V1 on FIG. 2A. In that case, the portion 204b of buried layer 204 under isolated region 242, and regions 234 and 236 each share the same potential V1. However, due to the PN junctions formed by the interaction of regions 234 and 236 with regions 230 and 232, respectively, the potential of the portions 204a and 204c of buried layer 204 under regions 230 and 232 are reduced by some amount below V1 to a lower potential V3. For example, if V1 is set to a $V_{iso,rated}$ of 80V, V3 may be equal to approximately 60V.

Polysilicon 224 and 226 are surrounded by oxide 216 and 218, respectively, and each have a floating potential (indicated by label V2 on FIG. 2A). As such, the potential of polysilicon 224 and 226 is free to float and become coupled to a potential falling somewhere between V1 and V3 (the coupling is analogous to capacitive coupling). With V1 equal to 80V and V3 equal to 60V, the voltage V2 may float to approximately 40V, for example. In this example, because the difference between V1 and V2 is reduced over a conventional device, the portion 204b of buried layer 204 under isolated region 242 experiences a stronger field-plate effect offered by higher potential of polysilicon 224 and 226, resulting in less electrical field at the weakest point of the isolation structure (indicated by dashed circles 225 and 227). In this manner, the weak points 225 and 227 of isolation structure 200 are able to sustain higher biasing voltage, in other words, higher isolation breakdown voltage, $BV_{sub}$.

Surrounding the second isolation trench structure, substrate 202 is at a reference potential (V5), which may be set to 0V or other reference voltage. Polysilicon 222 and 228 are surrounded by oxide 214 and 220, respectively and each have a floating potential (indicated by label V4 on FIG. 2A). As such, the potential of polysilicon 222 and 228 is free to float and becomes coupled to a potential (V4) falling somewhere between V3 and V5 (the coupling is analogous to capacitive coupling). For example, in this example V3 may be equal to 60V and V5 is equal to ground. As such, the voltage V4 may float to approximately 20V. Accordingly, in the second trench the difference between V3 and V5 is only 60V, again resulting in reduced electrical field at the weakest points of the isolation structure (indicated by dashed circles 223 and 229) compared to that of the conventional isolation structure depicted in FIG. 1A. Accordingly, the weakest points of the structure depicted in FIG. 2A (indicated by dashed circles 223 and 229) are able to sustain higher biasing voltage, in other words, higher isolation voltage BVsub.

Figure 2B:
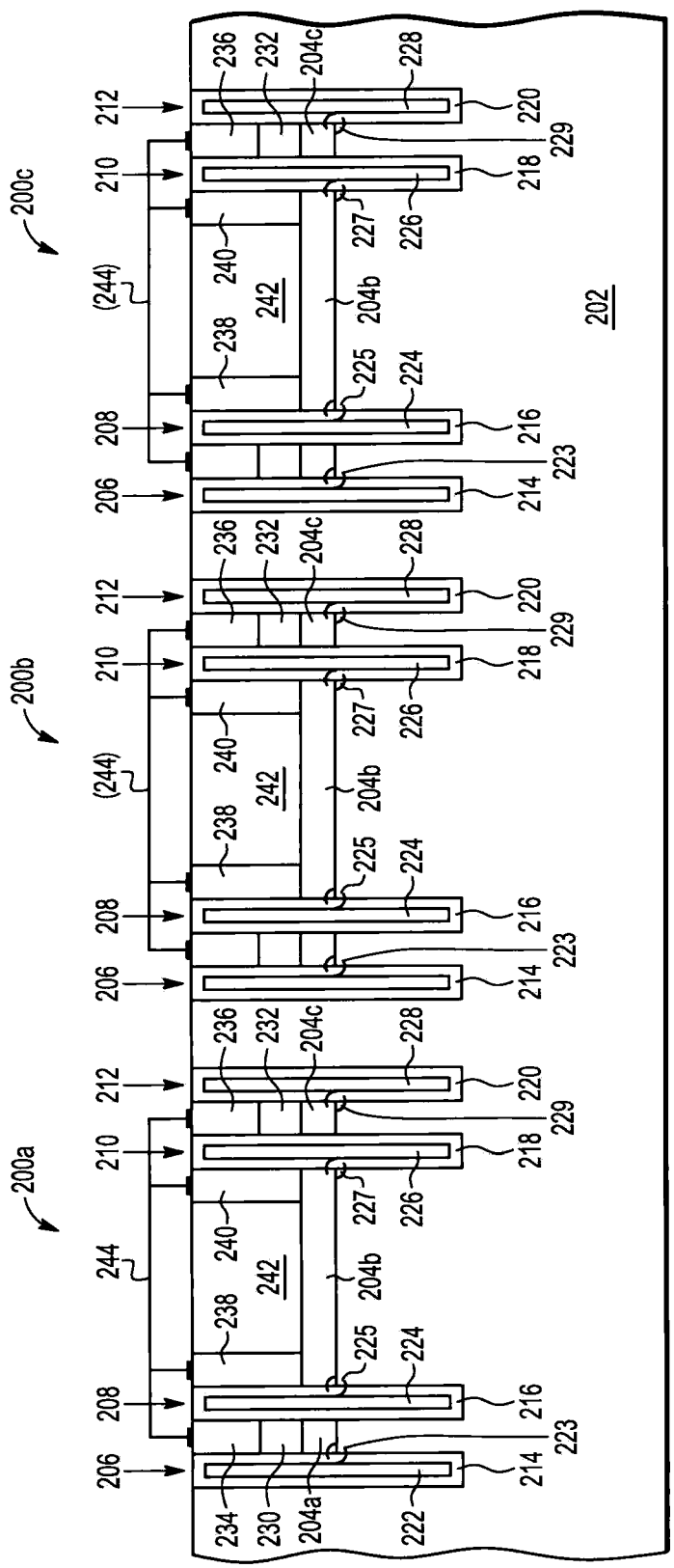
FIG. 2B is a simplified cross-sectional view showing the isolation structure of FIG. 2A duplicated across a substrate as a number of separate isolation structures.

As discussed above, the isolation structure 200 may be duplicated any number of times across a single substrate to provide electrical isolation to one or more electronic components formed over that substrate. FIG. 2B, for example, shows the isolation structure 200 of FIG. 2A, duplicated across a substrate 202 as separate isolation structures 200a, 200b, and 200c. Different electronic components may be formed within the isolated regions 242 of each of isolation structures 200a, 200b, and 200c, which are then electrically isolated from one another.

Figure 3A:
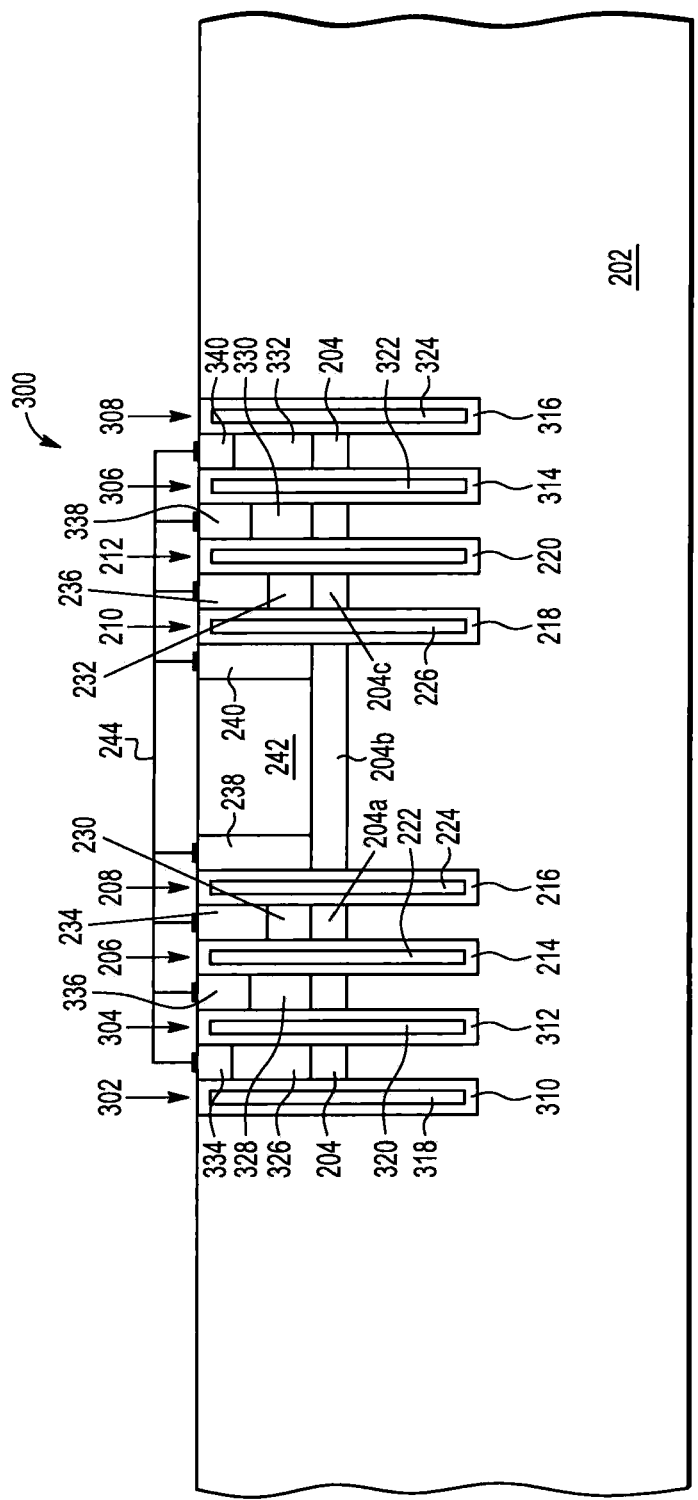
FIG. 3A is a simplified cross-sectional view showing the isolation structure of FIG. 2A including additional punch-through structures and isolation trenches formed about an isolated region.

In some cases, as described above, multiple sets of isolation trenches and corresponding punch-through structures may be at least partially formed about an isolated region to provide electrical isolation thereto. FIG. 3A, therefore, depicts an exemplary isolation structure 300 including additional punch-through structures and isolation trenches formed about an isolated region. Specifically, isolation structure 300 includes the isolation structure 200 depicted in FIG. 3A, but with additional punch-through structures and corresponding isolation trenches.

In FIG. 3A, additional isolation trenches 302, 304, 306, and 308 are formed over substrate 202. Oxide 310, 312, 314, and 316, as well as corresponding polysilicon 318, 320, 322, and 324, are formed in each of isolation trenches 302, 304, 306, and 308, respectively.

Punch-through structures are then formed between each of the additional isolation trenches. Specifically, regions 326, 328, 330, and 332 are formed over portions of highly doped buried layer 204. Regions 326, 328, 330, and 332 are generally of the same conductivity type as that of substrate 202. Over each of regions 326, 328, 330, and 332, regions 334, 336, 338 and 340 are formed, respectively. Regions 334, 336, 338 and 340 are generally of the opposite conductivity type to that of substrate 202.

Isolation structure 300, therefore, includes three-punch structures formed at either side or about a portion of isolated region 242. Region 334 and 326 form part of a first punch-through structure. Region 336 and 328 form part of a second punch-through structure. Region 234 and 230 form part of a third punch-through structure. Region 236 and 232 form part of a fourth punch-through structure. Region 338 and 330 form part of a fifth punch-through structure. Region 340 and 332 form part of a sixth punch-through structure.

As illustrated in FIG. 3A, the depth and doping concentration of each of the punch-through structures (and, specifically, regions 334, 336, 234, 236, 338, and 340) is adjusted to modify the punch-through voltage of each structure. In one implementation, the regions are configured so that the punch-through voltage of each punch-through structure is increased moving away from the central isolated region 242. This can be achieved by gradually reducing the depth or height of regions 234, 336, and 336, moving inward to outward, as depicted in FIG. 3A. Also as depicted in FIG. 3A, the depth or height of regions 236, 338, and 340 is also reduced, moving inward to outward, by a corresponding amount. By reducing the depth or height of the portions of each punch-through structure that have the opposite conductivity type to the substrate 202 (i.e., regions 334, 336, 234, 236, 338, and 340), and correspondingly increasing the height of the portions of the punch through structures that are the same conductivity type as the substrate 202 (i.e., regions 326, 328, 230, 232, 330, and 332), moving away from the isolated regions, the voltage drop across the portions of the buried layer under each punch-through structure is reduced, thereby reducing the burden on the weakest parts of the isolation structure. Accordingly, this configuration provides that the electrical field formed within the isolation structure is spread out across the main isolation junction beneath isolated region 242 as well as the isolation junctions of the additional isolation trench rings and punch-through structures. In one implementation, the punch-through structures are configured to achieve an approximately 10V-30V higher punch-through voltage for each additional isolation trench ring moving away from the central isolated region.

Figure 3B:
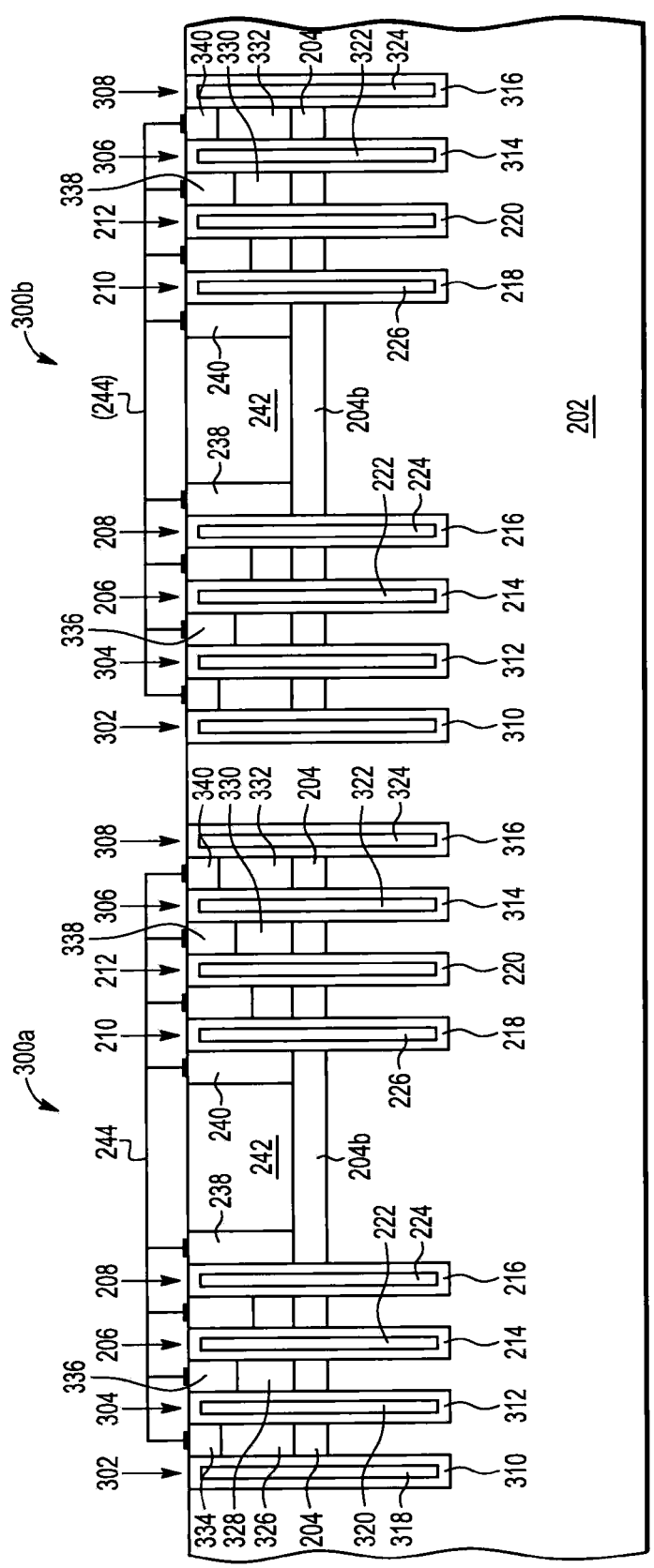
FIG. 3B is a simplified cross-sectional view showing the isolation structure of FIG. 3A, duplicated across a substrate as separate isolation structures.

As discussed above, the isolation structure 300 may be duplicated any number of times across a single substrate to provide electrical isolation to one or more electronic components formed over that substrate. FIG. 3B, for example, shows the isolation structure 300 of FIG. 3A, duplicated across a substrate 202 as separate isolation structures 300a and 300b. Different electronic components may be formed within the isolated regions of each of isolation structures 300a and 300b, which are then electrically isolated from one another.

Figure 4:
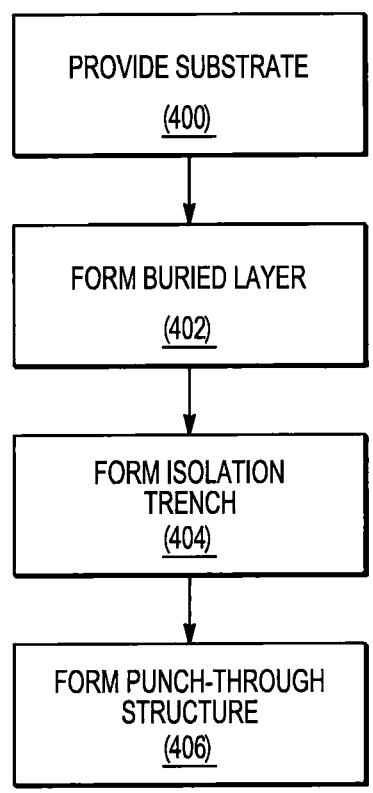
FIG. 4 is a flowchart illustrating an exemplary method for forming an isolation structure in accordance with the present disclosure.

FIG. 4 is a flowchart illustrating an exemplary method for forming an isolation structure in accordance with the present disclosure. In step 400 a substrate is provided. The substrate may be of any appropriate conductivity type and may include one or more layers of differing materials, as required. In step 402, a buried layer is formed over or within the substrate. The buried layer may be formed, in one implementation, by doping, e.g. by ion implantation and subsequent thermal annealing. For example, by using a blanket i.e. non-masked approach, a sheet resistance of about 10 to 15 Ohms/square can be achieved.

In step 404, an isolation trench is formed over or within the substrate. The isolation trench defines at least a portion of an isolated region of the isolation structure. The isolation trench may be formed by etching a trench into the substrate, where the trench extends a number of micrometers into the substrate through the buried layer. Accordingly, the trench extends through the buried layer and ends in the substrate. After the trench is etched, a thick isolation layer can be grown or deposited on the trench sidewalls. This can be oxide, nitride, or a combination of both, for example. The remaining trench can then be filled with a filling material like polysilicon, i.e. a conductive material.

Finally, in step 406, a punch-through structure is formed. The punch through structure may be formed around a portion of the isolation trench, or may be formed about the entirety of the isolation trench. The punch-through structure includes a portion of the buried layer, such that a reverse bias of the second portion of the buried layer to the substrate is less than a reverse bias of the first portion of the buried layer of the substrate due to the punch-through structure. Generally, the punch-through structure includes a first region over the portion of the buried layer that is of the same conductivity type of the substrate. A second region, having an opposite conductivity type to that of the substrate, is then formed over the first region. The first and second regions of the punch-through structure located over the buried layer may be formed by any suitable doping or deposition process.

The present disclosure describes various embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The described steps of any method described herein are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present disclosure has been provided in terms of one or more preferred embodiments, and it should be appreciated that many equivalents, alternatives, variations, and modifications, aside from those expressly stated, are possible and within the scope of the invention.

What is claimed is:

1. A method, comprising:
    forming a buried layer over a substrate of a first conductivity type;

forming a first isolation trench around an isolated region, the isolated region being disposed over a first portion of the buried layer;

forming a second isolation trench around the first isolation trench; and forming a punch-through structure between at least a portion of the first isolation trench and a portion of the second isolation trench by:

forming a first region over a second portion of the buried layer, the first region having the first conductivity type, and forming a second region located over the first region, the second region having a second conductivity type.

2. The method of claim 1, wherein, when the isolated region is set to a greater than zero potential with respect to the substrate, a voltage across the second portion of the buried layer to the substrate is less than a voltage across the first portion of the buried layer to the substrate.

3. The method of claim 1, wherein the isolated region has a conductivity type opposite of the substrate conductivity type.

4. The method of claim 3, including forming a second punch-through structure around the second isolation trench, the second punch-through structure including a third portion of the buried layer.

5. The method of claim 4, wherein, when the isolated region is set to the greater than zero potential with respect to the substrate, a voltage across the third portion of the buried layer to the substrate is less than a voltage across the first portion of the buried layer to the substrate.

6. The method of claim 4, wherein forming the second punch-through structure:

forming a third region over the third portion of the buried layer, the third region having the first conductivity type, and forming a fourth region over the third region, the fourth region having the second conductivity type.

7. The method of claim 6, wherein a depth of the first region of the first punch-through structure is greater than a depth of the third region of the second punch-through structure.

\* \* \* \* \*